United States Patent
Karinca et al.

(10) Patent No.: US 12,237,819 B2
(45) Date of Patent: Feb. 25, 2025

(54) HYBRID FILTER CIRCUIT AND SYSTEM WITH HYBRID FILTER CIRCUIT

(71) Applicant: TDK Electronics AG, Munich (DE)

(72) Inventors: Yasin Karinca, Röfingen (DE); Christian Gesell, Syrgenstein (DE)

(73) Assignee: TDK Electronics AG, Munich (DE)

( * ) Notice: Subject to any disclaimer, the term of this patent is extended or adjusted under 35 U.S.C. 154(b) by 75 days.

(21) Appl. No.: 18/332,468

(22) Filed: Jun. 9, 2023

(65) Prior Publication Data

US 2023/0412151 A1 Dec. 21, 2023

(30) Foreign Application Priority Data

Jun. 20, 2022 (DE) .......................... 102022115293.6

(51) Int. Cl.
| | | |
|---|---|---|
| *H03H 11/06* | (2006.01) | |
| *G01R 29/26* | (2006.01) | |
| *H03H 11/12* | (2006.01) | |

(52) U.S. Cl.
CPC ............. *H03H 11/06* (2013.01); *G01R 29/26* (2013.01); *H03H 11/1217* (2013.01)

(58) Field of Classification Search
CPC ....................................................... H03H 11/06
USPC ......................................................... 327/552
See application file for complete search history.

(56) References Cited

U.S. PATENT DOCUMENTS 10,819,214 B2  10/2020  Karinca et al.
11,502,670 B2  11/2022  Arndt et al.
11,515,780 B2  11/2022  Karinca
2008/0024951 A1*  1/2008  Mortensen ............. H02M 1/44
  361/118

FOREIGN PATENT DOCUMENTS

| DE | 102017102608 B3 | 5/2018 |
| DE | 102017104894 A1 | 9/2018 |
| DE | 102018102122 A1 | 8/2019 |

OTHER PUBLICATIONS

J.Schmenger, et al., "Active hybrid common mode filter for a highly integrated on-board charger for automotive applications," 2015 IEEE 13th Brazilian Power Electronics Conference and 1st Southern Power Electronics Conference (COBEP/SPEC), 2015; Conference Paper, Publisher: IEEE (7 pages).

(Continued)

*Primary Examiner* — Tomi Skibinski
(74) *Attorney, Agent, or Firm* — Ice Miller LLP; Justin D. Swindells

(57) ABSTRACT

A hybrid filter circuit for reducing common-mode interference signals with frequencies of at least 150 kHz in a power line with at least one phase. The circuit has a passive filter stage and an active filter unit with an active filter stage. The circuit can be coupled to an electrical device on a load side and to a power supply system on a supply side via the power line. The first active filter stage includes a sensor for measuring a common mode noise signal in the power line and a feedback unit with an active amplifier unit for generating a compensation signal counteracting the common mode noise signal, which is coupled into the power line via an output of the first active filter stage. The passive filter stage and the active filter circuit are arranged in cascade between the load terminal and a supply terminal.

18 Claims, 8 Drawing Sheets

(56) References Cited

OTHER PUBLICATIONS

Dr. Bastian Arndt, et al., "Breitbandiger aktiver Hybrid-Filter für Kfz-Anwendungen (Broadband Active Hybrid Filter for Automotive Applications)," Internationale Fachmesse und Kongress für Elektromagnetische Verträglichkeit, Düsseldorf, 2018, S. 432-438.

Wenjie Chen, et al., "A Novel Hybrid Common-Mode EMI Filter With Active Impedance Multiplication," IEEE Transactions on Industrial Electronics, vol. 58, No. 5, May 2011, pp. 1826-1834.

Marcelo Lobo Heldwein, et al., "Implementation of a Transformerless Common-Mode Active Filter for Offline Converter Systems," IEEE Transactions on Industrial Electronics, vol. 57, No. 5, May 2010, pp. 1772-1786.

Shuo Wang, et al., "Investigation of Hybrid EMI Filters for Common-Mode EMI Suppression in a Motor Drive System," IEEE Transactions on Power Electronics, vol. 25, No. 4, Apr. 2010, pp. 1034-1045.

Vuttipon Tarateeraseth, "Three-Phase Common-Mode Active EMI Filters for Induction Motor Drive Applications," Journal of Power Electronics, vol. 18, No. 3, May 2018, pp. 871-878.

Wenjie Chen, et al., "An Experimental Study of Common- and Differential-Mode Active EMI Filter Compensation Characteristics," IEEE Transactions on Electromagnetic Compatibility, vol. 51, No. 3, Aug. 2009, pp. 683-691.

\* cited by examiner

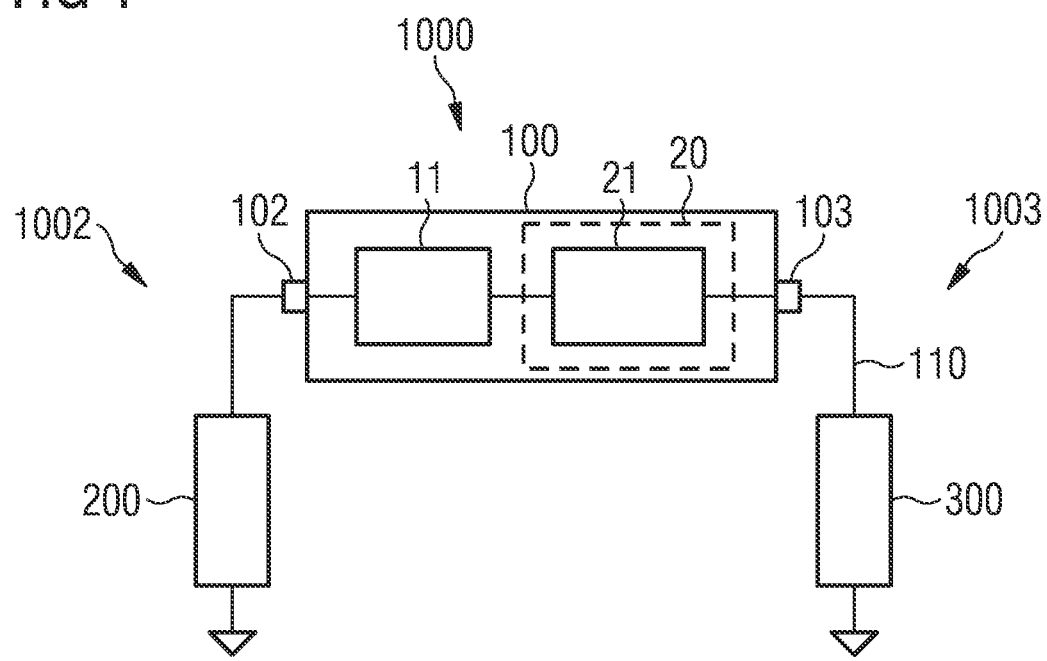
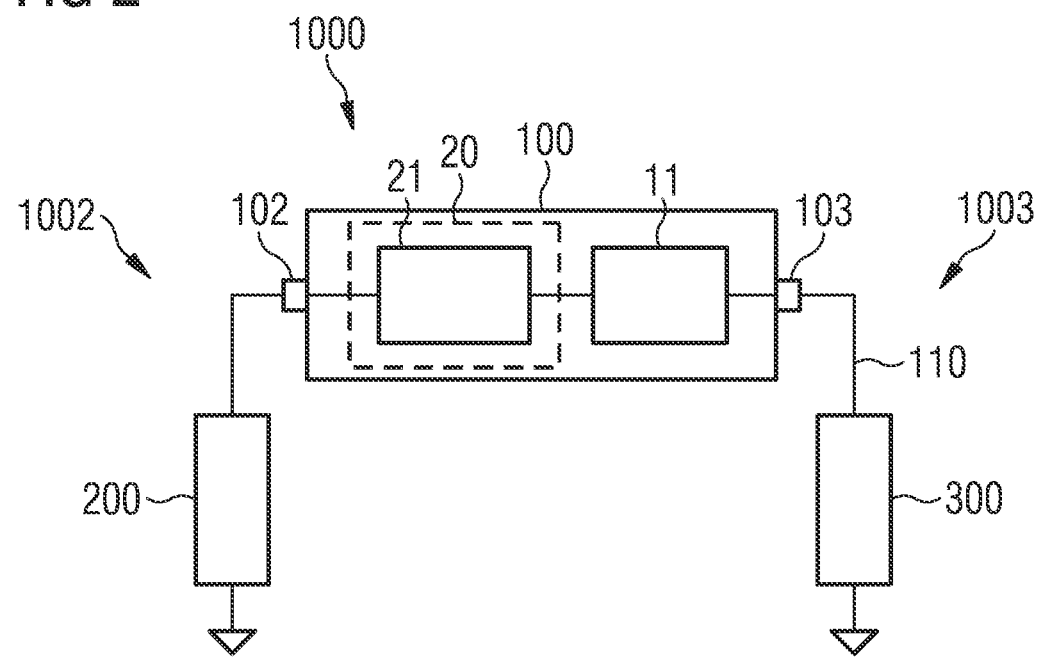

HYBRID FILTER CIRCUIT AND SYSTEM WITH HYBRID FILTER CIRCUIT

CROSS-REFERENCE TO RELATED APPLICATION

This application is a U.S. Patent Application that claims priority to Germany Patent Application No. 102022115293.6, filed on Jun. 20, 2022, the disclosure of which is incorporated herein by reference in its entirety.

A hybrid filter circuit is specified, in particular a hybrid filter circuit for suppressing common-mode interference, in particular common-mode interference at least with frequencies greater than or equal to 150 kHz. Furthermore, a system with such a hybrid filter circuit is disclosed.

Frequency converters are often used for the electrical supply of electrical systems that have electrical devices such as motors, which can generate, among other things, common-mode interference currents that flow in the same direction in all lines. To suppress these and thus avoid EMC problems (EMC: electromagnetic compatibility), line filters are used, for example. While passive and also active filters are known for low-frequency interference such as leakage currents, purely passive filters are usually used to suppress higher-frequency common-mode interference, especially in the range above 150 kHz. Such filters usually consist of passive components such as chokes, i.e., coils, and capacitors, suitably connected to form a low-pass filter, whereby electromagnetic interference currents can be suppressed, improving electromagnetic compatibility. However, depending on the common-mode interference currents that occur, the chokes must be sized accordingly, which can result in a large size as well as high costs.

At least one object of certain embodiments is to provide a hybrid filter circuit. At least one further object of certain embodiments is to provide a system comprising a hybrid filter circuit.

These objects are solved by subject-matters according to the independent patent claims. Advantageous embodiments and developments of the subject-matters are characterized in the dependent claims and are further apparent from the following description and the drawings.

According to at least one embodiment, a hybrid filter circuit is intended and embodied for reducing common mode noise signals in a power line. "Reduction" may mean here and in the following a decrease or even a complete suppression. Preferably, the hybrid filter circuit is configured and intended for reducing common mode noise signals at least with frequencies greater than or equal to 150 kHz. Particularly preferably, the hybrid filter circuit is configured and intended for reducing common mode noise signals having frequencies at least of greater than or equal to 150 kHz and at least of less than or equal to 30 MHz. The power line may have at least one phase, which here and hereinafter particularly means that the power line has one, two, three or more than three phases. Thus, the phrase "at least one phase" particularly includes cases with more than one phase. Furthermore, the power line may have, for example, a neutral line. The reduction of common mode noise signals may be performed, for example, in multiple phases or in at least one phase and the neutral line.

In particular, the hybrid filter circuit can make it possible to reduce common-mode interference in a frequency range with frequencies greater than or equal to 150 kHz and at least less than or equal to 30 MHz, which can be caused, for example, by conducted interference emissions, also referred to as "conducted emission". In particular, the hybrid filter circuit is intended and configured to reduce or even completely suppress common-mode interference currents in the said frequency range, which, for example, usually occur in frequency converters in the form of pulses with a large edge steepness. Thereby, an attenuation of the common-mode interference with a low-pass characteristic can be achieved, so that the hybrid filter circuit can form a line filter which, on the one hand, can limit the electrical interference from an electrical device into the power grid and, on the other hand, can increase the electromagnetic compatibility of electrical devices with respect to interference originating from the power grid, so that an increase in immunity to electromagnetic interference can be achieved.

According to a further embodiment, the hybrid filter circuit can be coupled to an electrical device on a load side via a load terminal and to a power supply system on a supply side via a supply terminal, the power supply system and the electrical device being coupled directly or indirectly via the power line and thus via the at least one phase.

According to a further embodiment, a system comprises a power grid and an electrical device that are directly or indirectly coupled to at least one phase via a power line. Furthermore, the system comprises a hybrid filter circuit which is coupled to the electrical device on a load side via a load terminal and to the power grid on a supply side via a supply terminal.

The features described above and below apply equally to the hybrid filter circuit and to the system with the hybrid filter circuit.

According to a further embodiment, the hybrid filter circuit has at least a first passive filter stage and an active filter unit having at least a first active filter stage, which are arranged in cascade between the load terminal and the supply terminal. "Arranged in cascade" can mean, in particular, that the output of a filter stage is directly coupled to the input of a subsequently arranged filter stage. Thus, the hybrid filter circuit has a combination of at least one passive filter stage and an active filter unit with at least one active filter stage, which are particularly preferably configured such that the hybrid filter circuit has a low-pass characteristic and can reduce common-mode interference in the power line, preferably in a frequency range of at least greater than or equal to 150 kHz and less than or equal to 30 MHz.

For example, the at least one first passive filter stage can be arranged on the supply side as viewed from the active filter unit. Alternatively, the at least one first passive filter stage may be arranged at the load side as viewed from the active filter unit. Furthermore, the hybrid filter circuit may comprise at least one second passive filter stage, wherein the active filter unit is arranged between the first and second passive filter stages.

A passive filter stage of the hybrid filter circuit, i.e. the first passive filter stage and, if present, the second passive filter stage, can have an inductor, in particular at least a coil, especially preferably in the form of a common-mode choke. For example, a coil may be arranged in each phase or in each phase and the neutral line. The coils may have a common core. In particular, the first passive filter stage and, if present, the second passive filter stage may be formed by at least one coil and one or more capacitors. Particularly preferably, the first passive filter stage is arranged to have a cutoff frequency and a resonant frequency that are both less than 150 kHz or preferably less than or equal to 120 kHz. If a second passive filter stage is present, the same applies to the second passive filter stage.

Particularly preferably, a passive filter stage of the hybrid filter circuit, i.e. the first passive filter stage and/or the second passive filter stage, can be formed from one or more capacitors to ground and a common-mode choke. In this way, an attenuation and, in particular, a slowing down of rapidly rising and pulse-like currents, which are usually generated by frequency converters, for example, can be achieved. Such a passive filter stage can be adapted in its component values and thus in the corresponding cut-off frequency and, particularly preferably, can be configured as a low-pass LC element preferably with a cut-off frequency and a resonant frequency of less than 150 kHz in each case, in order to avoid resonances in the frequency range of the conducted emission. Particularly preferably, the coil can have an inductance of less than or equal to 500 μH or even less than or equal to 300 μH.

The use of a described passive filter stage on the load side, particularly in the form of the first passive filter stage, can provide additional damping performance and support the active filter unit by slowing rising and falling edges of common mode currents. This can reduce relative errors due to run and delay times of the active components, thereby improving overall performance. Furthermore, a passive filter stage arranged at the supply side, which is the last filter stage of the hybrid filter circuit in the filter stage cascade of the hybrid filter circuit as viewed in a direction from the load side to the line side and which can be the first or second passive filter stage, can be configured as described above and serve for residual filtering of still existing common-mode noise signals and bring about a further increase in performance. In particular, just such a passive filter stage can be dimensioned with considerably low component values compared to classical, purely passive EMC filters, in which coils with inductances of more than one 1 mH are usually used, since, for example, in the case of a secondary passive filter stage, the upstream active filter unit can already enable a significant reduction in the common-mode interference signal currents and thus also a significantly optimized saturation behavior of the common-mode choke used here. Even though the exact specifications of the components used depend on the common-mode interference that occurs, which in turn may depend, for example, on the electrical equipment used and its design, compared with common-mode chokes in conventional passive common-mode interference filters, the inductance in the passive filter stages used here can preferably be reduced by at least a factor of 4 or preferably by at least a factor of 5. In particular, at least a halving of the common-mode choke turns may be possible, which may allow a significant reduction in weight and construction volume. A further reduction may be possible by using additional Y-capacitors.

According to a further embodiment, the first active filter stage comprises a sensor for measuring a common-mode noise signal in the current line and thus in the at least one phase or in the at least one phase and the neutral line. The sensor may preferably be configured to detect a current representative of a sum of common-mode currents of all phases or all phases and the neutral line with respect to a reference potential, in particular with respect to ground. In particular, the common mode noise signal may thus have a common mode noise signal current with a common mode noise signal current strength corresponding to the sum of the common mode currents, and the sensor is a current sensor. Preferably, the sensor is coupled to the power line and thus to the at least one phase or the at least one phase and the neutral. In particular, the sensor may be inductively coupled. The common-mode interference signal currents flowing through the power line can thus be detected in the form of a sum signal. Particularly preferably, the current sensor is arranged to generate a measurement current that is proportional to the common-mode interference signal current. For example, the sensor can have a current transformer or be configured as a current transformer. For example, the current transformer is formed as an inductive current transformer and has a primary side with a primary winding and a primary inductance and a secondary side with a secondary winding and a secondary inductance. The inductive current transformer can, for example, have a primary winding with only one or a few turns for each phase or for each phase and the neutral line, through each of which the current to be measured flows. Furthermore, the current transformer may have a secondary winding with a larger number of turns so that the secondary current is reduced relative to the primary current to be measured, inversely proportional to the ratio of the number of primary and secondary turns. For example, the current transformer may be a through-type transformer in which each phase, or each phase and the neutral, is passed through a toroid of the transformer, each corresponding to a single primary winding. The current transformer can thus have three primary windings for three phases, as an example. If common-mode interference signal currents flow through the primary windings of the current transformer, the measuring current is induced in the secondary winding, which depends on the number of turns of the secondary winding.

Furthermore, the sensor may have two terminals between which a resistor, which may also be referred to as a burden resistor, is connected so that the resistor is connected in parallel with the sensor. The measuring current preferably flows through the burden resistor, so that a measuring voltage defined by the measuring current and the resistance value of the burden resistor can be tapped at the burden resistor, which serves to control the further components of the first active filter stage.

According to a further embodiment, the first active filter stage has a feedback unit with an active amplifier unit for generating a compensation signal counteracting the common-mode interference signal, which is fed into the power line via an output of the first active filter stage, i.e., for example, into each phase or into each phase and the neutral line. The first active filter stage, and in particular the feedback unit with the active amplifier unit, is thus preferably configured to generate a compensation signal in the form in a compensation signal current which is substantially opposite to the common-mode interference signal current. In particular, this may mean an equal or at least substantially equal amplitude and an opposite sign with respect to the direction of the common mode noise signal current. An opposite sign may also mean, in particular in the case of an oscillating common-mode interference signal, a phase shift of 180° or at least substantially 180°. "Substantially" can mean in each case that, with respect to the amplitude and/or with respect to the current direction reversal and/or with respect to the phase shift, full compensation is not achieved, for example, due to tolerances and/or measurement inaccuracies and/or bandwidth limitations. For example, "substantially" can mean a deviation of less than or equal to 20% or less than or equal to 10% or less than or equal to 5%.

The first active filter stage can comprise as an active amplifier unit at least a preamplifier stage and a main amplifier stage coupled to an output of the preamplifier stage. An input of the preamplifier stage, which may comprise, for example, an operational amplifier or a discrete transistor circuit, i.e., a circuit constructed from discrete electronic elements, which may comprise transistors in particular, may be coupled to the measurement voltage directly or also via a suitable circuit, which may set the DC operating point, for example. The preamplifier stage is configured, for example, in such a way that a control signal proportional to the measurement voltage and, in particular, inverted, is output at the output of the preamplifier stage and thus at the input of the main amplifier stage for driving the main amplifier stage.

The main amplifier stage may particularly preferably be formed by a discrete transistor circuit and be, for example, a class A amplifier or preferably a class B or class AB amplifier. In particular, the main amplifier stage may be intended and embodied to generate at an output a compensation signal current strength of greater than or equal to 1 ampere or preferably of greater than or equal to 10 amperes or particularly preferably of greater than or equal to 20 amperes, which is dependent on the control signal at the input of the main amplifier stage.

The output of the main amplifier stage is coupled, for example via an output resistor and a coupling circuit, to the power line and thus to the at least one phase or the at least one phase and the neutral line, so that the compensation signal can be coupled into the power line. Furthermore, the output of the main amplifier stage can be coupled, for example via a feedback line with a further resistor, to a further input of the preamplifier stage, in particular a differential input. This forms the feedback unit, which forms an internal control loop by which the accuracy can be increased.

The first active filter stage is thus preferably based on the CSCA principle (CSCA: "current sensing/current activation") and measures the common-mode interference signal in the power line. If a passive filter stage, i.e. in particular the first passive filter stage described above, is connected upstream of the active filter unit, a common-mode interference signal current already attenuated by the passive filter stage is measured by the sensor of the first active filter stage. The measured common-mode interference signal current is converted into a measurement voltage, which is then in turn preferably inverted by means of the preamplifier stage and subsequently amplified by the main amplifier stage in the form of the compensation signal current. This compensation signal, which is directed in the opposite direction to the common-mode interference signal, is coupled into the power line accordingly, with the common-mode interference signal being suppressed by destructive interference. In particular, the first active filter stage can be configured in such a way that the current strengths required for this purpose are generated by the main amplifier stage, while the preamplifier stage is preferably provided and configured only for inverting the measurement voltage and for driving the main amplifier stage. Since the output of the main amplifier stage is preferably fed back to the inverting input of the preamplifier stage, an internal control loop with increased accuracy can be achieved.

According to a further embodiment, the active filter unit has at least one further active filter stage which is arranged between the first active filter stage and the power supply system immediately downstream of the first active filter stage. The first active filter stage and the further active filter stage are thus arranged in cascade, with the first active filter stage being configured to provide a higher output current than the second active filter stage. In particular, the further active filter stage can correspond to the first active filter stage in terms of structure and function, but be free of a main amplifier stage. An amplifier stage corresponding to the preamplifier stage of the first active filter stage, for example comprising an operational amplifier, can thus preferably be the only amplifier stage of the further active filter stage.

The further active filter stage can thus correspond in principle to the first active filter stage, but without having a corresponding main amplifier stage. Since the levels of the common-mode interference signal can already be suppressed considerably by the first active filter stage, it may be possible for an operational amplifier to suffice directly in the further active filter stage to generate a further compensation signal current. The further active filter stage can be set up in such a way that it can achieve significantly higher accuracy than the first active filter stage, which can lead to an additional increase in the performance of the hybrid filter circuit. The principle of cascading the active filter stages is possible because both filter stages are formed by current-based feedforward controls.

As an alternative to a further active filter stage, it may also be possible to configure the first active filter stage in such a way that no further active filter stage is required and that the active filter unit thus consists of the first active filter stage.

Compared with conventional, purely passive EMC filters, the hybrid filter circuit described here is characterized by the use of additional active components, which makes it possible to reduce the size of the passive components. In particular, it is possible to replace the part of the filter performance that is achieved in the classic case by a large common-mode choke with an active circuit that is significantly smaller in terms of size. This can result in one or more of the following advantages:

- Reduction of the total construction volume of the hybrid filter circuit compared to classic passive EMC filters
- Reduction of the weight of the hybrid filter circuit compared to classic EMC filters
- Reduction of the costs of the hybrid filter circuit compared to classic EMC filters
- Possible increase in the attenuation performance of the hybrid filter circuit compared to classic EMC filters.
- Possible use of the active circuit as an add-on for existing filters and thereby increase the already existing filter performance A significant difference to previously known active filters is that, in particular in addition to an operational amplifier, further components are used to amplify the compensation signal. This makes it possible to generate compensation signal currents of more than 1 ampere (peak) in the relevant frequency range and taking into account rapidly rising edges of the interference signal in a time range of less than 200 ns, which cannot be realized with purely integrated filters, or only very uneconomically. In particular, the following advantages can result:

- Possibility of active suppression of common-mode noise signal currents above 1 ampere (peak) and preferably above 20 amperes (peak)
- Resulting significant reduction in passive components

BRIEF DESCRIPTION OF THE DRAWINGS

Further advantages, advantageous embodiments and further developments are revealed by the embodiments described below in connection with the figures.

FIG. 1 shows a schematic illustration of a system with a hybrid filter circuit according to an embodiment.

FIG. 2 shows a schematic illustration of a system with a hybrid filter circuit according to a further embodiment.

DETAILED DESCRIPTION OF THE INVENTION

Figure 3:
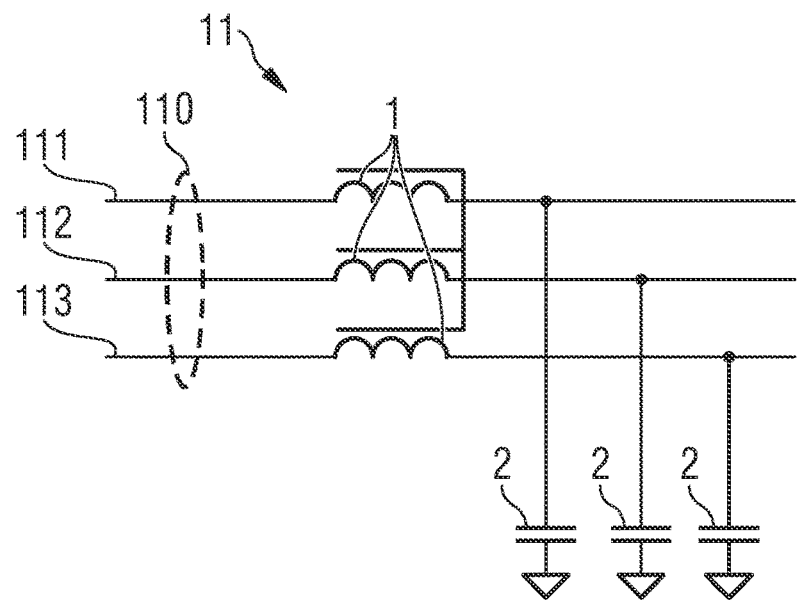
FIGS. 3 and 4 show schematic illustrations of filter stages of the hybrid filter circuit according to further embodiments.

In the embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

In connection with the figures, a hybrid filter circuit 100 and a system 1000 comprising the hybrid filter circuit 100 according to several embodiments are shown, wherein the hybrid filter circuit 100 is intended and embodied for reducing common mode noise signals in a power line 110. In particular, the hybrid filter circuit 100 is intended and embodied for reducing common mode noise signals at least having frequencies greater than or equal to 150 kHz and at least less than or equal to 30 MHz. The power line 110 is used to couple an electrical device 200 to a power grid 300 and may include at least one phase. Furthermore, the power line may comprise, for example, a neutral line. Common mode noise reduction may be provided, for example, in multiple phases or in at least one phase and the neutral line. By way of example only and not limiting, the following description refers to a power line 110 having three phases 111, 112, 113 in which common mode noise signals are reduced by the hybrid filter circuit 100.

FIG. 1 shows the system 1000 with a hybrid filter circuit 100 according to an embodiment. The system 1000 comprises the electrical device 200 and the power system 300, which are schematically indicated in FIG. 1 and which are coupled to each other by the power line 110. The side of the system 1000 with the electrical device 200 is also referred to as the load side 1002, while the side of the system 1000 with the power grid 300 is also referred to as the supply side 1003. The electrical device 200 may, for example, be a drive system and include a motor and a frequency converter for controlling the motor. In addition, other electrical devices are also possible.

Furthermore, the system 1000 comprises a hybrid filter circuit 100 coupled to the electrical device 200 at the load side 1002 via a load terminal 102 and coupled to the power system 300 at the supply side 1003 via a supply terminal 103. The hybrid filter circuit 100 comprises at least a first passive filter stage 11 and an active filter unit 20 comprising at least a first active filter stage 21, which are arranged in cascade between the load terminal 102 and the supply terminal 103. The hybrid filter circuit 100 thus has a combination of at least one passive filter stage 11 and an active filter unit 20 with at least one active filter stage 21, which are particularly preferably configured in such a way that the hybrid filter circuit 100 has a low-pass characteristic and can reduce common-mode interference in the power line 110, preferably at least in a frequency range of greater than or equal to 150 kHz and less than or equal to 30 MHz. If the first passive filter stage 11 is arranged on the load side 1002 as shown in FIG. 1, this may also be referred to as the primary passive filter stage.

FIG. 2 shows a further embodiment in which, compared to the embodiment shown in Figure, the first passive filter stage 11 is arranged on the supply side 1003 and thus downstream of the active filter unit 20 as seen from the load side 1002. In this case, the first passive filter stage 11 may also be referred to as a secondary passive filter stage.

FIG. 3 shows an example of an embodiment of a passive filter stage which can form the first passive filter stage 11 of the hybrid filter circuit shown in FIGS. 1 and 2 and which has an inductor, in particular at least coil 1, particularly preferably in the form of a common-mode choke. In FIG. 3, the current line 110 is indicated with the above-mentioned purely exemplary three phases 111, 112, 113. Each phase 111, 112, 113 is preferably coupled to a coil 1, which particularly preferably have a common core. Furthermore, each phase 111, 112, 113 is coupled with at least one capacitor 2 to ground, the coils 1 and capacitors 2 being particularly preferably embodied such that the passive filter stage 11 has a cut-off frequency and a resonant frequency which are both less than 150 kHz or preferably less than or equal to 120 kHz. In the shown configuration of the passive filter stage 11 with the common-mode choke and the capacitors against ground, a low-pass LC element is formed, by which an attenuation and in particular a slowing down of fast-rising and pulse-like currents are achieved, which are usually generated for example by frequency converters.

The use of the described passive filter stage 11 as the primary passive filter stage at the load side 1002, as shown in FIG. 1, can thus provide additional damping performance and support the downstream active filter unit by slowing rising and falling edges of common mode currents. This can reduce relative errors due to run and delay times of the active components, thus improving overall performance. The use of such a passive filter stage 11 as a secondary passive filter stage at the supply side 1003, as shown in FIG. 2, can serve to provide residual filtering of residual common-mode noise signals and further improve the performance.

Figure 4:
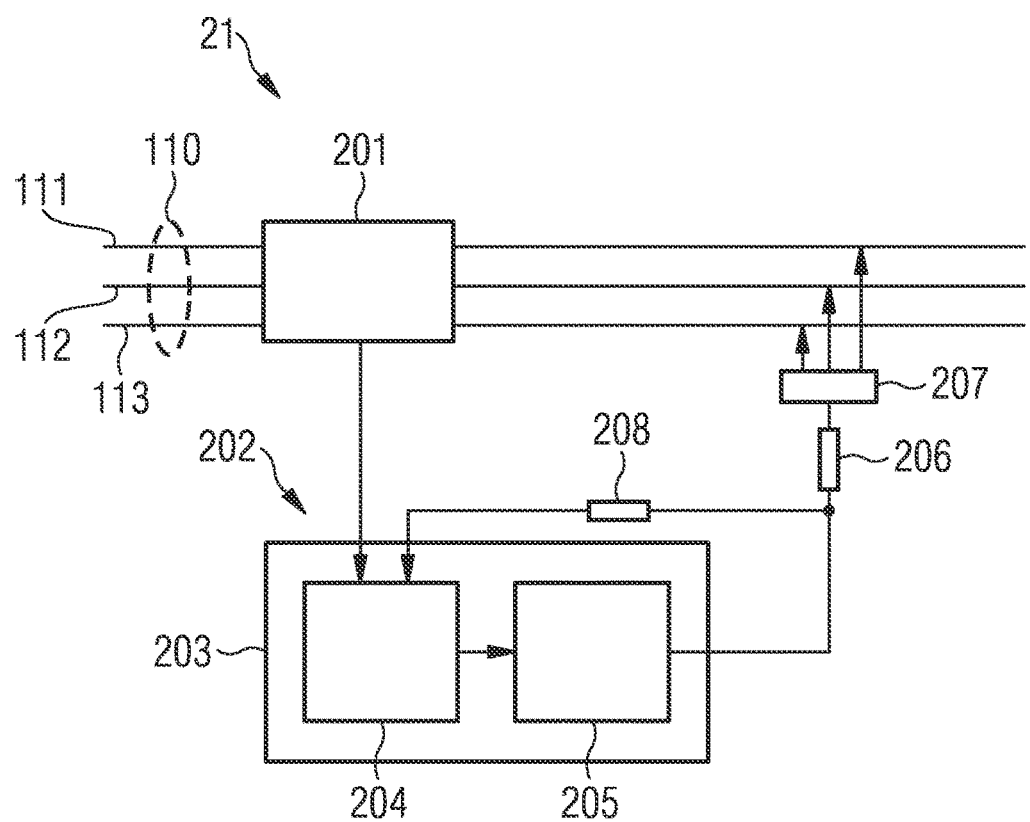

FIG. 4 shows an embodiment for the first active filter stage 21 of the active filter unit. The first active filter stage 21 has a sensor 201 for measuring a common-mode interference signal in the current line 110 and thus, in the embodiment shown, in the purely by way of example shown three phases 111, 112, 113. The sensor 201 is configured to sense a current representative of a sum of common mode currents of all phases 111, 112, 113 with respect to ground. Thus, the sensor 201 is a current sensor that outputs as a measuring value at an output a common mode noise signal current strength of the common mode noise signals corresponding to the sum of the common mode noise signal currents in the phases 111, 112, 113 of the current line 110 or a value proportional thereto.

Furthermore, the first active filter stage 21 has a feedback unit 202 with an active amplifier unit 203 for generating a compensation signal counteracting the common-mode interference signal, which is fed into the current line 110, for example into each phase 111, 112, 113, via an output of the first active filter stage 21. The first active filter stage 21, and in particular the feedback unit 202 with the active amplifier unit 203, is preferably configured to generate a compensation signal in the form of a compensation signal current which is substantially opposite to the common mode noise signal current. This may mean, as described in the general part, in particular an equal or at least substantially equal amplitude and an opposite sign with respect to the direction of the common mode noise signal current.

The first active filter stage 21 may comprise, as an active amplifier unit 203, at least a preamplifier stage 204 and a main amplifier stage 205 coupled to an output of the preamplifier stage 204. An input of the preamplifier stage 204, which may for example comprise an operational amplifier or a discrete transistor circuit, may be coupled to an output of the sensor 201 directly or also via a suitable circuit which may for example adjust the DC operating point. The preamplifier stage 204 is configured, for example, to output, at the output of the preamplifier stage 204 and thus at the input of the main amplifier stage 205, a control signal that is proportional to the measuring value of the sensor 201 and, for example, inverted, for driving the main amplifier stage 205. The main amplifier stage 205 is particularly preferably configured such that at an output of the main amplifier stage 205 a compensation signal current with a compensation signal current strength of greater than or equal to 1 ampere or preferably of greater than or equal to 10 amperes or particularly preferably of greater than or equal to 20 amperes is generated, which is dependent on the control signal at the input of the main amplifier stage 205.

The output of the main amplifier stage 205 is coupled via an output resistor 206 and a coupling circuit 207 to the current line 110 and thus to the exemplarily shown three phases 111, 112, 113, so that the compensation signal can be coupled into the current line 110. Furthermore, the output of the main amplifier stage 205 is coupled to another input of the preamplifier stage 204, for example via a feedback line having a feedback resistor 208. This forms the feedback unit 202, which forms an internal control loop by which accuracy can be increased. Further features of the first active filter stage 21 are described in connection with FIG. 7.

Figure 5:
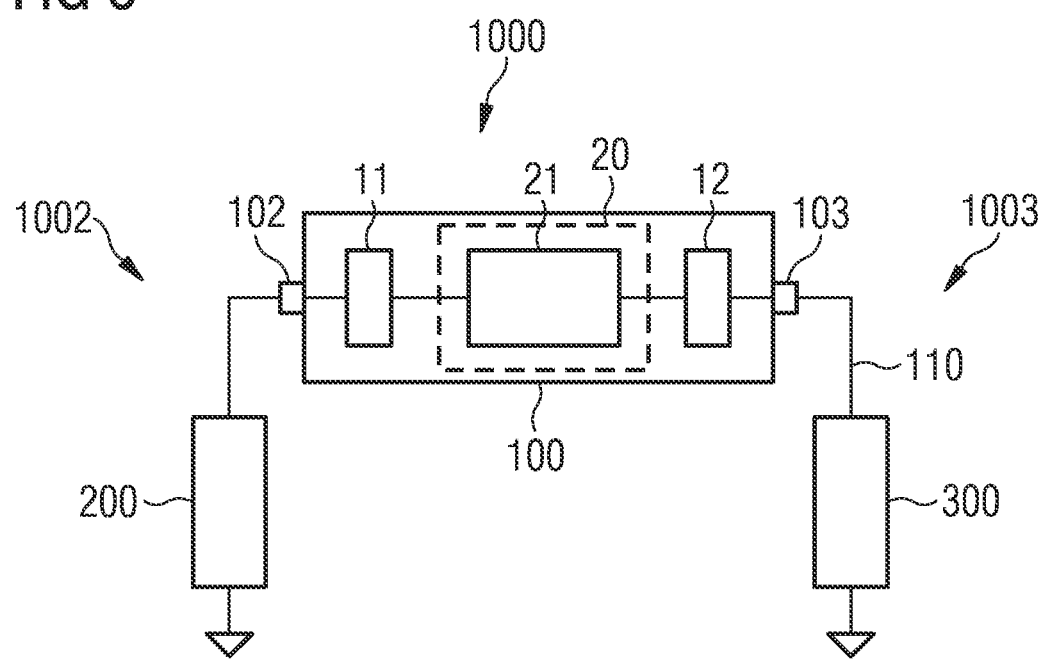
FIGS. 5 and 6 show schematic illustrations of systems with a hybrid filter circuit according to further embodiments.

FIG. 5 shows a further embodiment in which, in comparison with the embodiments of FIGS. 1 and 2, the hybrid filter circuit 100 additionally has a second passive filter stage 12. The first passive filter stage 11, the active filter unit 20 and the second passive filter stage 12 are arranged in cascade between the load side 1002 and the supply side 1003, as viewed from the load side 1002. The active filter unit 20 is arranged between the first and second passive filter stages 11, 12. In this case, the first passive filter stage 11 forms a primary passive filter stage, while the second passive filter stage 12 forms a secondary passive filter stage. The first and second passive filter stages 11, 12 may be constructed as described in connection with FIG. 3 and may have the same or different component specifications.

Figure 6:
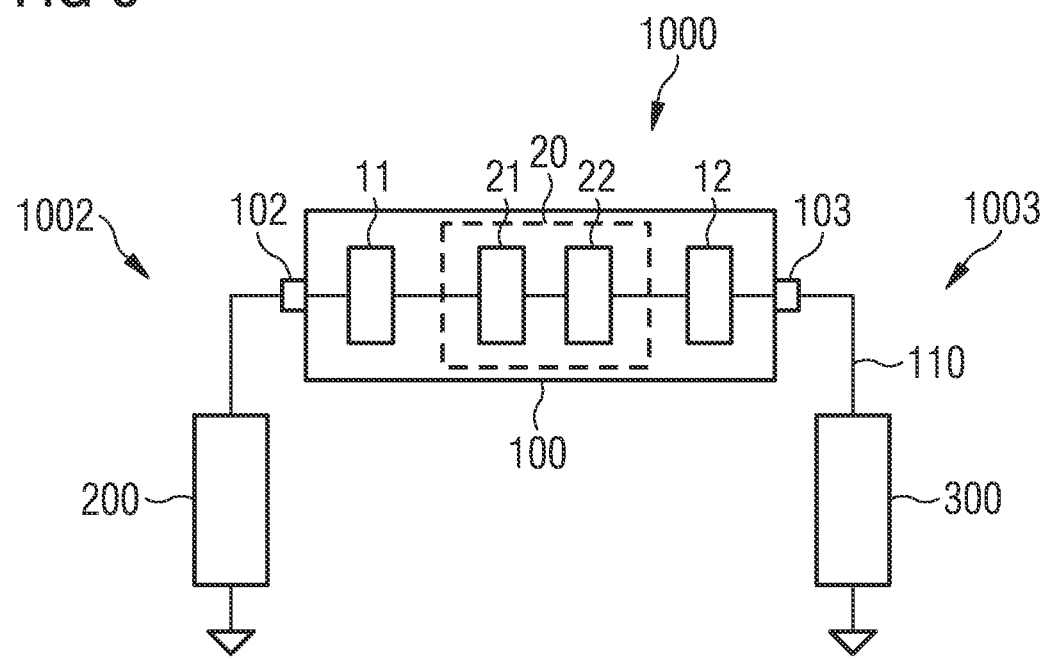

FIG. 6 shows a further embodiment in which, in comparison with the previous embodiment, the active filter unit 20 of the hybrid filter circuit 100 has, in addition to the first active filter stage 21, at least one further active filter stage 22 which is arranged between the first active filter stage 21 and the power supply system 300 immediately downstream of the first active filter stage 21. The first active filter stage 21 and the further active filter stage 22 are thus arranged in cascade between the first and second passive filter stages 11, 12, the first active filter stage 21 being configured to provide a higher output current than the second active filter stage 22.

Figure 7:
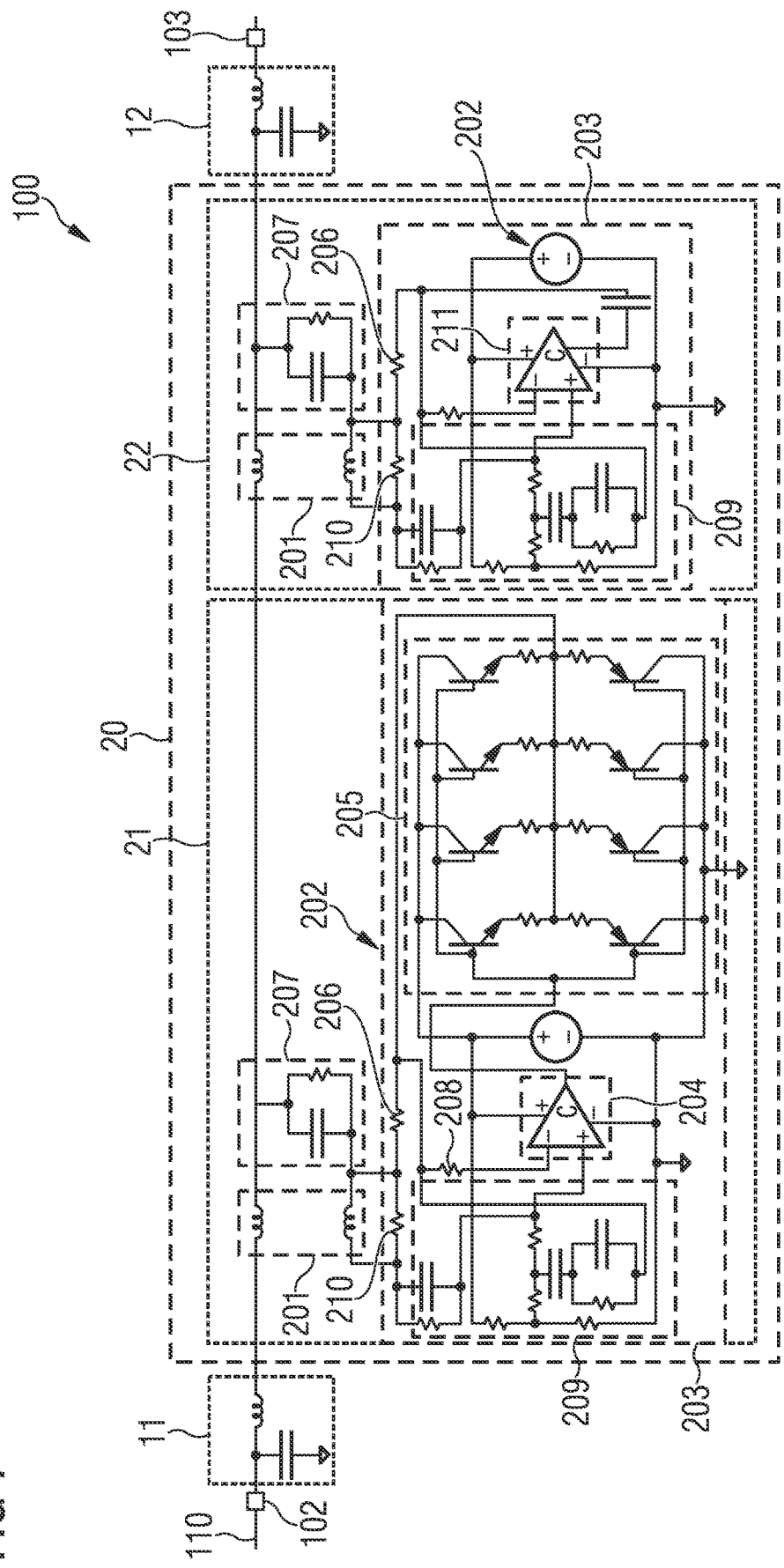
FIG. 7 shows a schematic illustration of a hybrid filter circuit according to a further embodiment.

In FIG. 7, the hybrid filter circuit 100 according to the embodiment of FIG. 6 is shown in a circuit diagram, wherein a common mode model is shown in which the phases of the power line 110 are combined into one line to simplify the representation. The passive and active filter stages 11, 12, 21, 22 described below may also be used in the other embodiments described previously. The parameters of passive and active components given below represent a preferred embodiment, but are not to be understood as limiting.

The first passive filter stage 11, which forms the primary passive filter stage on the load side, has a low-pass LC element formed by a common-mode inductor and capacitors to ground, as described in connection with FIG. 3. In the common mode model shown, the inductor has an inductance of 35 µH. The capacitors to ground, represented by the effective capacitor shown, have an effective capacitance of 190 nF. The second passive filter stage 12, which forms the secondary passive filter stage on the supply side, can be sized even smaller and in the common mode model shown has an inductor with an inductance of 14 µH and an effective capacitor with an effective capacitance of 130 nF. Accordingly, the first and second passive filter stages 11, 12 have cutoff and resonant frequencies of less than 150 kHz, which are thus outside the intended frequency range of the hybrid filter circuit 100. The passive filter stages 11, 12 can thus be dimensioned with very low component values compared to classical, purely passive EMC filters, since the active filter unit 20 described below can take over the main part of the reduction of the common-mode interference signal currents.

As described in connection with FIG. 4, the first active filter stage 21 comprises a sensor 201 for measuring a common-mode noise signal in the power line and a feedback unit 202 with an active amplifier unit 203 for generating the compensation signal current.

The sensor 201 is configured as an inductive current sensor in the form of a current transformer with a primary side and a secondary side. The primary side is coupled to the current line 110, i.e., in the shown embodiment to the phases of the current line 110. The common-mode interference signal currents flowing through the current line 110 can thus be detected in the form of a sum signal. The inductive current transformer has a primary winding with only one or a few turns for each phase on the primary side. In the embodiment shown, the secondary side has a secondary winding with, for example, a number of turns greater by a factor of 10000, so that the secondary current flowing in the secondary winding is proportional to the measured common-mode interference signal current, but is reduced relative to the latter by said factor. The current transformer is configured, for example, as a through-hole transformer in which, in the present embodiment, each phase is passed through a toroidal core of the transformer, each corresponding to a single primary winding. The current transformer can thus have three primary windings for three phases, as an example. If common-mode interference signal currents flow through the primary windings of the current transformer, a secondary current is induced in the secondary winding as described, which can also be referred to as the measuring current.

Furthermore, the sensor 201 has two terminals on the secondary side between which a so-called burden resistor 210 is connected, which is thus connected in parallel with the sensor 201. The measuring current flows through the burden resistor 210, so that a measuring voltage defined by the measuring current and the resistance value of the burden resistor 210 can be tapped at the burden resistor 210, which serves to control the further components of the first active filter stage 21, in particular the active amplifier unit 203. In the embodiment shown, the burden resistor 210 has a resistance value of 100Ω.

The active amplifier unit 203 comprises a preamplifier stage 204 and a main amplifier stage 205 coupled to an output of the preamplifier stage 204. As shown, the preamplifier stage 204 may be formed by an operational amplifier, which may be of the LT1206 type, for example. Alternatively, the preamplifier stage 204 may be formed by a discrete transistor circuit. An input of the preamplifier stage may be coupled directly to the burden resistor 210 or, as in the embodiment shown, through an additional matching circuit 209 used to adjust the DC operating point.

The preamplifier stage 204 is preferably configured in such a way that a control signal proportional to the measurement voltage and, in particular, inverted is output at the output of the preamplifier stage 204 and thus at the input of the main amplifier stage 205 for driving the main amplifier stage 205. The compensation signal current is output at an output of the main amplifier stage 205. In particular, the first active filter stage 21 is configured in such a way that the current strengths required for the compensation signal current are generated solely by the main amplifier stage 205, while the preamplifier stage 204 is intended and configured only for inverting the measurement voltage and for driving the main amplifier stage 205. The main amplifier stage 205 is formed by a discrete transistor circuit, which may be, for example, a class B amplifier as shown. Furthermore, a class A amplifier or, particularly preferably, a class AB amplifier is also possible, for example. In particular, the main amplifier stage 205 is intended and embodied to generate at the output a compensation signal current strength of greater than or equal to 1 ampere (peak) or preferably of greater than or equal to 10 amperes (peak) or particularly preferably of greater than or equal to 20 amperes (peak), which is dependent on the control signal at the input of the main amplifier stage 205.

The output of the main amplifier stage 205 is coupled to the power line 110, and thus to the phases, via an output resistor 206, which has a resistance value of 1Ω in the embodiment shown, and a coupling circuit 207. The coupling circuit 207 in the embodiment shown has a resistor with a resistance value of 1 MΩ and an effective capacitor in the common mode model with an effective capacitance of about 7.5 µF. The effective capacitor in the common mode model is formed by a capacitor having a capacitance of 10 µF and, in series therewith, three capacitors connected in parallel, each coupled to a phase of the power line 110 and each having a capacitance of 10 µF.

Furthermore, the output of the main amplifier stage 205 is coupled to another input of the preamplifier stage 204, in particular a differential input, via a feedback line and a feedback resistor 208, which has a resistance value of 100Ω in the shown embodiment. This forms the feedback unit 202, which forms an internal control loop through which accuracy can be increased.

The further active filter stage 22 of the active filter unit 20 corresponds in principle to the first active filter stage 21, but does not have a corresponding main amplifier stage. The same reference numerals as for the first active filter stage 21 are therefore used to designate the components of the further active filter stage 22. However, the parameters and specifications of the components of the further active filter stage 22 may differ from those of the first active filter stage 21. Accordingly, like the first active filter stage, the further active filter stage 22 comprises a sensor 201, a burden resistor 210, a matching circuit 209, an output resistor 206, a feedback line comprising a feedback resistor 208 and a coupling circuit 208 and, instead of the preamplifier stage and the main amplifier stage of the first active filter stage, an amplifier stage 211 formed by an operational amplifier, for example of the LT1210 type. Since the levels of the common-mode interference signal can already be suppressed considerably by the first active filter stage 21, it is possible that in the further active filter stage 22 the operational amplifier is directly sufficient to generate a further, considerably smaller compensation signal current. The further active filter stage 22 can therefore also be configured in such a way that it can achieve a significantly higher accuracy than the first active filter stage 21, which can lead to an additional increase in the performance of the hybrid filter circuit. The principle of cascading the active filter stages 21, 22 is possible because both filter stages 21, 22 are formed by current-based feedforward controls. In contrast to the first active filter stage 21, the further filter stage 22 in the embodiment shown has, among other things, the following deviating parameters:

burden resistance: 220 Ω
output resistance: 2.2 Ω
effective capacitance of the effective capacitor of the coupling circuit: 2.475 µF; formed by 3 parallel capacitors with 3.3 µF each in series with another capacitor with 3.3 µF To determine the filter performance of the individual filter stages of the hybrid filter circuit 100, measurements of the reduction of a common-mode noise signal current were made starting from the filter stages shown in FIG. 7 in various combinations of these.

Figure 8A:
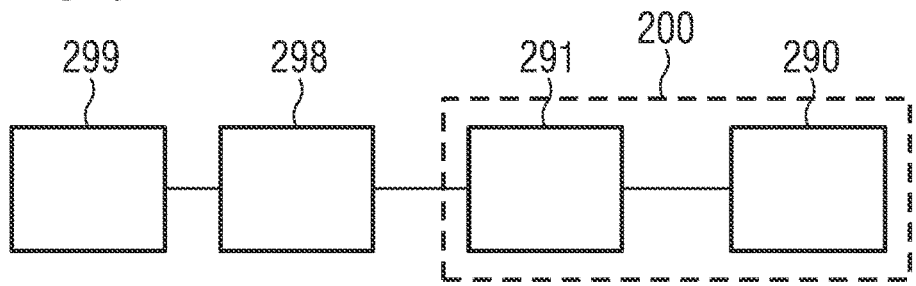
FIGS. 8A and 8B show schematic illustrations of measurement setups for determining the filter efficiency of the hybrid filter circuit and components thereof.
Figure 8B:
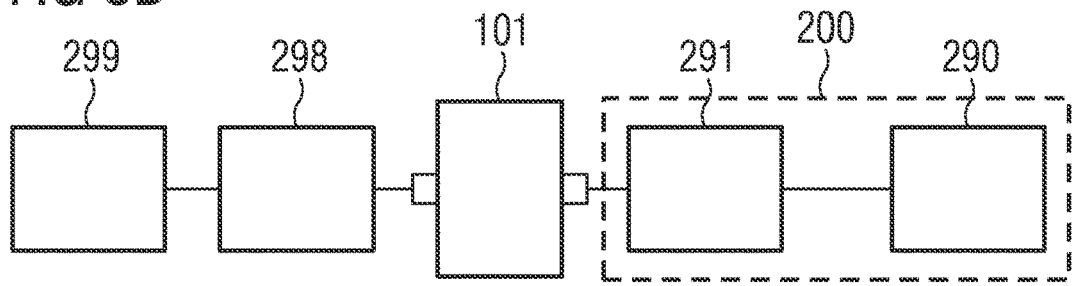

FIG. 8A shows a measurement setup for measuring unfiltered common mode noise signals in a system with a motor 290 and a frequency converter 291 as the electrical device 200. To measure the unfiltered common-mode noise signals, the electrical device 200 was directly connected to a measuring device 299, such as an oscilloscope or a frequency analyzer, via a line impedance stabilization network (LISN) 298, which simulates the power network. FIG. 8B shows a measurement setup in which a filter unit 101 is arranged between the electrical device 200 and the line impedance stabilization network 298, wherein the filter unit 101, as described below, had one or more filter stages of the hybrid filter circuit 100 shown in FIG. 7, so that the filtering effect of this one or more filter stages alone or in combination could be determined.

Figure 9A:
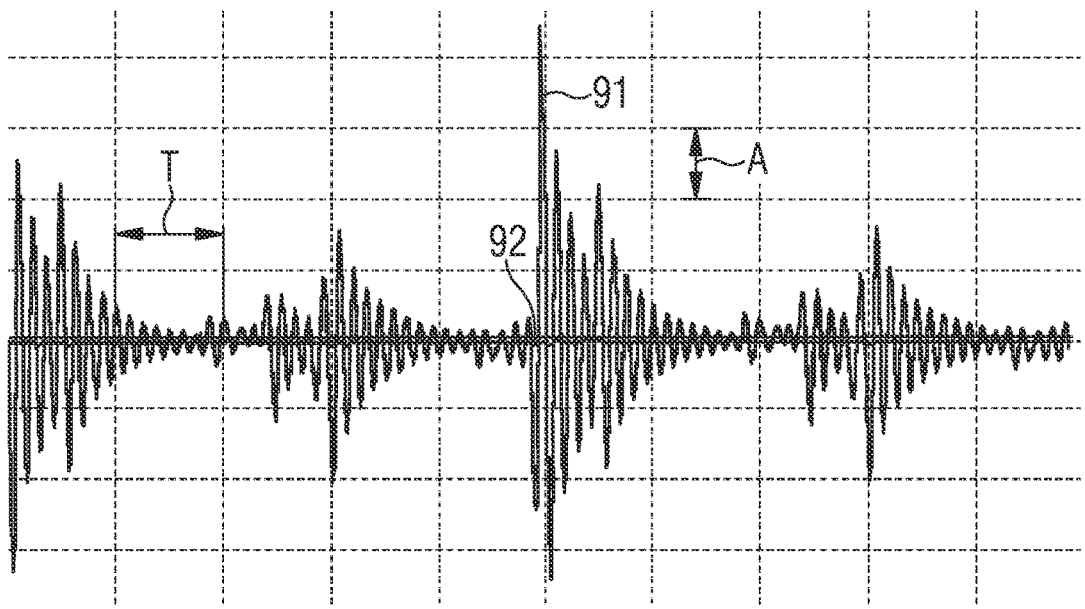
FIGS. 9A through 10E show measurements of the filter efficiency of the hybrid filter circuit and components thereof.
Figure 9B:
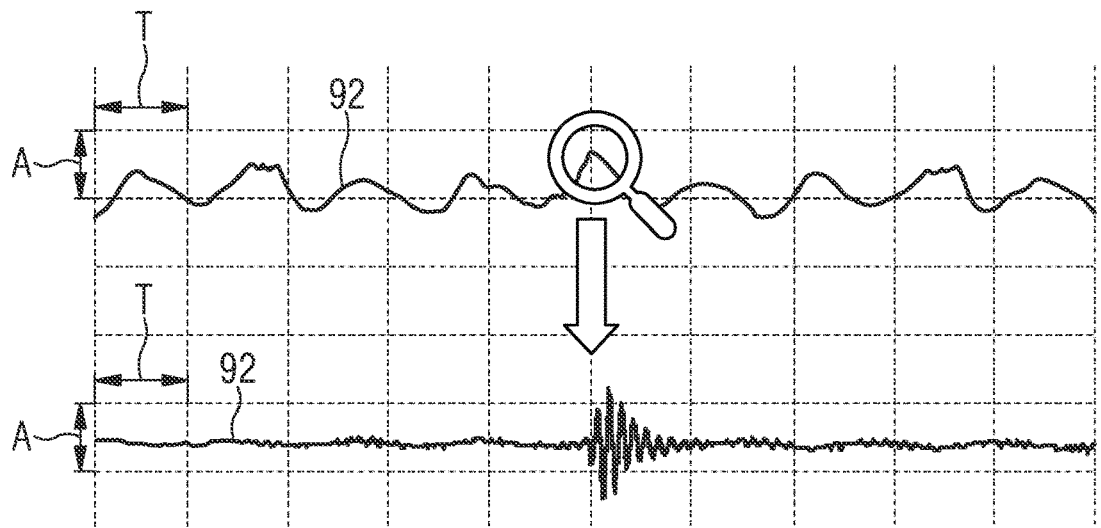

FIGS. 9A and 9B show time measurements of the common mode noise signals using an oscilloscope as the measuring device 299. The horizontal axis corresponds to the time course, the vertical axis to a measured time-dependent current strength. FIG. 9A shows, in comparison, on the one hand the unfiltered common-mode noise signals 91 on the load side and, on the other hand, the common-mode noise signals 92 measured by means of the measuring setup shown in FIG. 8B, which can still be measured on the supply side by means of the hybrid filter circuit 100 of FIG. 7 as filter unit 101. The vertical resolution A indicated in FIG. 9A corresponds to a common-mode interference signal current strength of 2.5 A, and the horizontal resolution T indicated corresponds to a time interval of 100 ms.

While the unfiltered common-mode noise signals 91 reached an amplitude of more than A on the load side, hardly any common-mode noise signals 92 are detectable on the supply side with the resolution shown.

FIG. 9B therefore shows enlargements of sections of the measurement on the supply side and thus of the filtered common-mode interference signals 92. The indicated resolutions A and T are 2 ms horizontal and 50 mA vertical in the upper section and 10 µs horizontal and 25 mA vertical in the lower section, which represents an enlargement by a factor of 200. Thus, while unfiltered common-mode interference signal current strengths of up to 12.5 A (peak) can be measured on the load side, only high-frequency common-mode interference signals with common-mode interference signal current strengths of less than 50 mA (peak) can be measured on the supply side due to the hybrid filter circuit. This shows that the hybrid filter circuit is capable of reducing common-mode interference very effectively.

FIGS. 10A to 10E show frequency spectra of unfiltered common-mode noise signals and of filtered common-mode noise signals, where for the former the measurement setup of FIG. 8A and for the latter different combinations of filter stages were used as filter unit 101 in the measurement setup of FIG. 8B. In addition to the measured frequency spectra, the limit values required by the standard are also shown. Unless otherwise stated, the measurements are so-called average measurements.

Figure 10A:
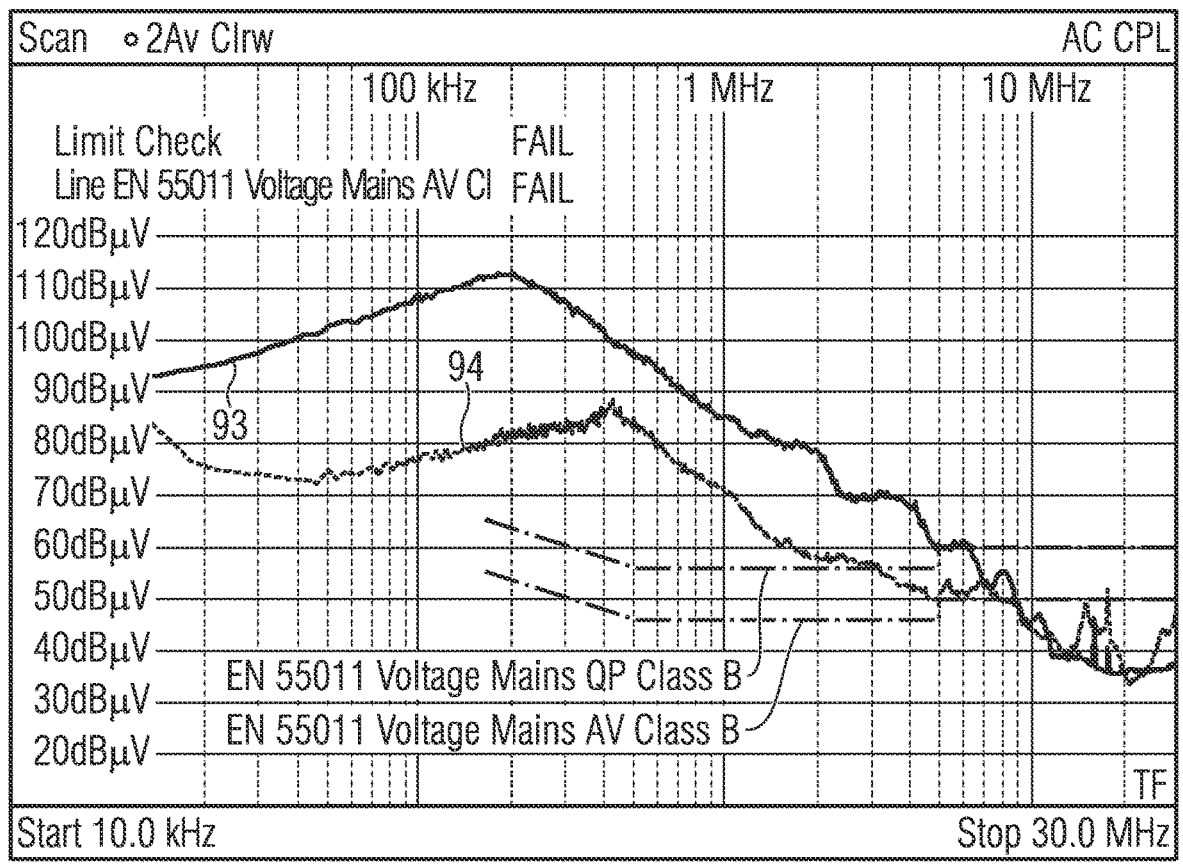

For comparison, FIG. 10A shows the frequency spectrum 93 of the unfiltered common-mode interference signals and the frequency spectrum 94 of the common-mode interference signals filtered solely by the active filter unit as filter element 101 in the test setup of FIG. 8B. A significant reduction in the common-mode interference signals is apparent, particularly in the range from 10 kHz to 10 MHz.

Figure 10B:
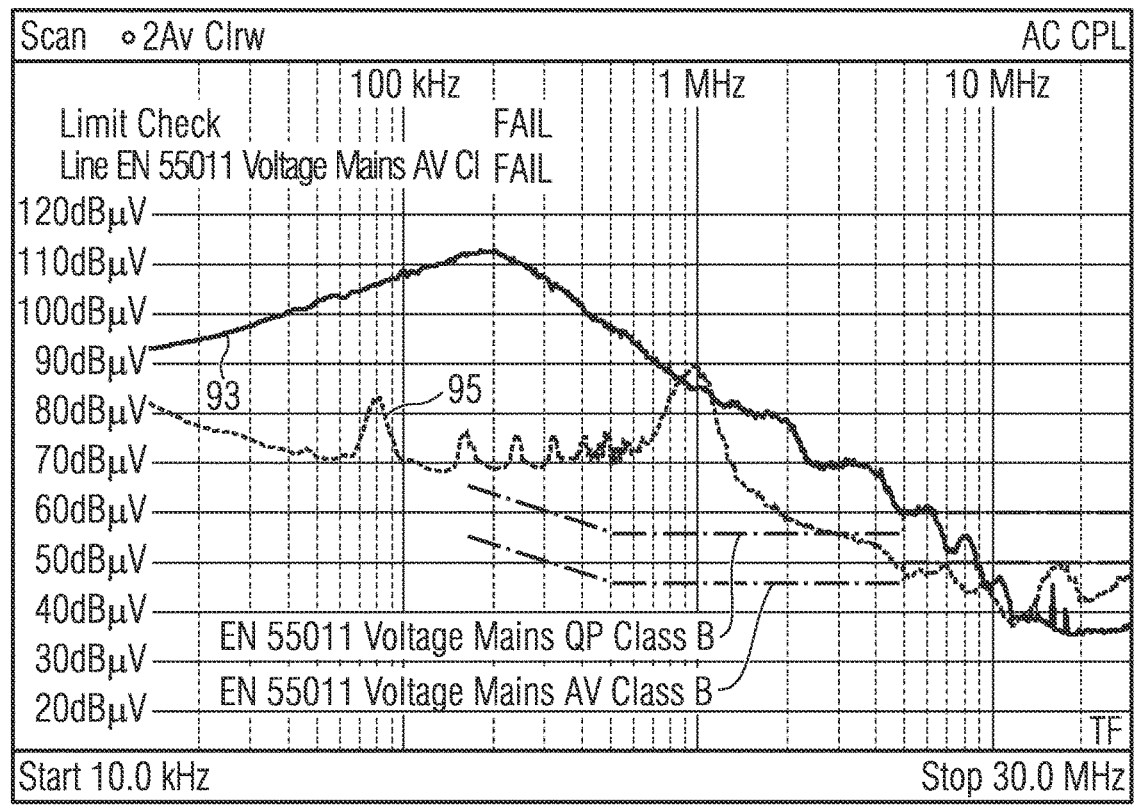

In FIG. 10B, instead of the purely active filter unit as filter unit 101 in the measurement setup of FIG. 8B, a hybrid filter circuit with a combination of the active filter unit with a primary passive filter stage was used for the measurement of the frequency spectrum 95 of the filtered common-mode noise signals. For the primary passive filter stage, which was configured according to the embodiment of FIG. 3, Y-capacitors with 130 nF each as well as a common mode choke with 8 μH were used. Compared to the measurement of FIG. 10A, a further reduction of the common mode noise signals caused by this hybrid filter circuit can be detected in the range from 100 kHz up to several 100 kHz.

Figure 10C:
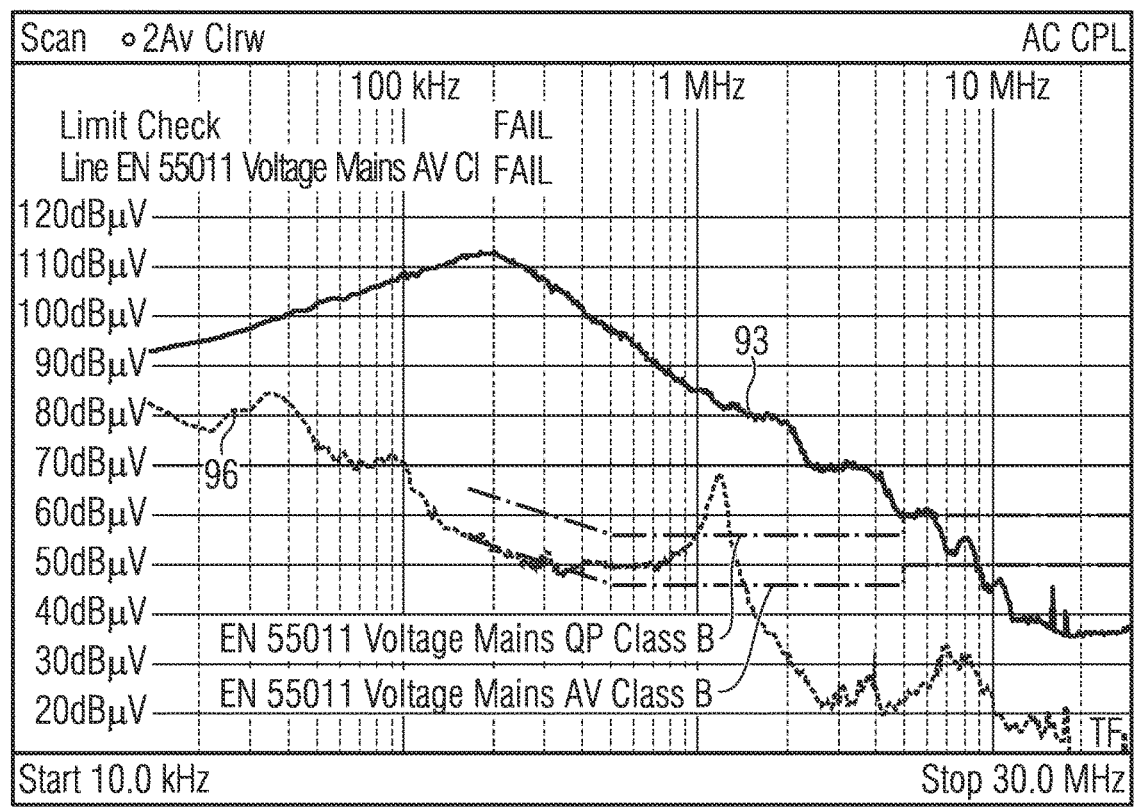

For the measurement of the frequency spectrum 96 of the filtered common-mode noise signals in FIG. 10C, instead of a hybrid filter circuit with a primary passive filter stage, a hybrid filter circuit with a secondary passive filter stage was used as the filter unit 101 in the measurement setup of FIG. 8B, which had the same components as those of the primary passive filter stage on which the measurement shown in FIG. 10B was based. Compared to the measurement of FIG. 10A, a significant reduction of common mode noise signals can be detected, especially in the relevant frequency range of greater than or equal to 150 kHz and less than or equal to 30 MHz by using the hybrid filter circuit.

Figure 10D:
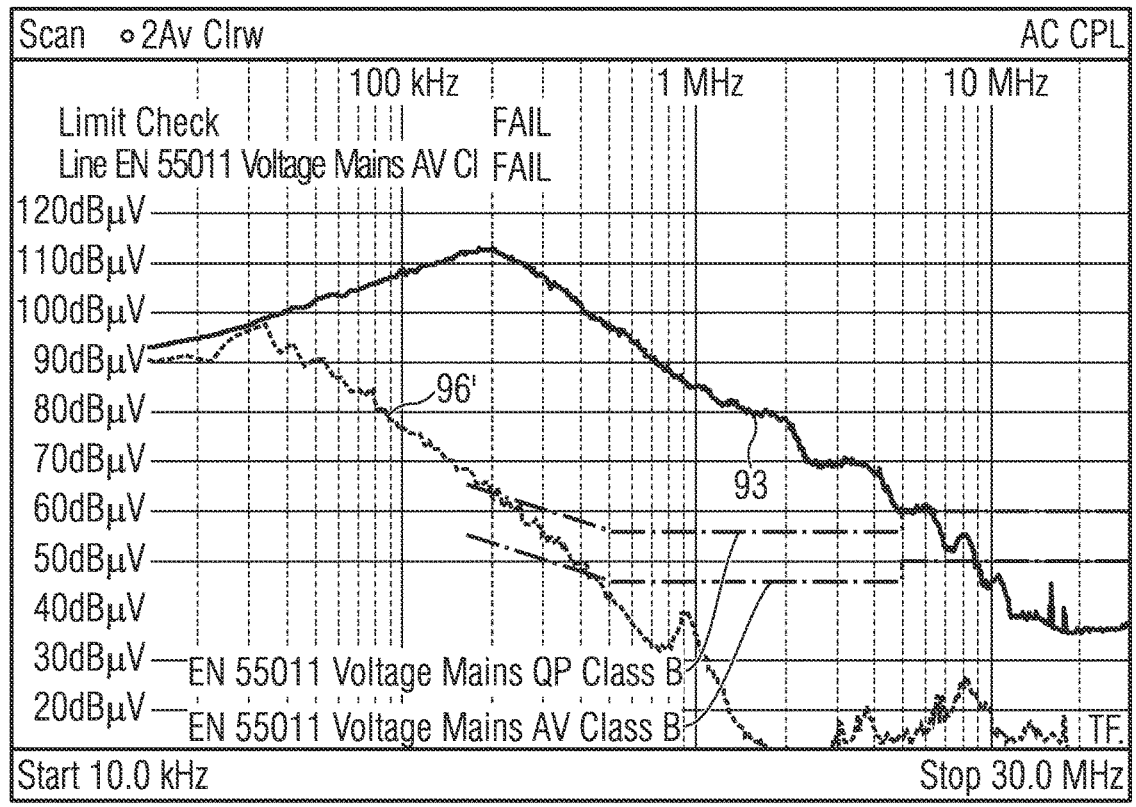

FIG. 10D shows a frequency spectrum 96' corresponding to the measurement in FIG. 10C. In comparison with the hybrid filter circuit on which the frequency spectrum 96 is based, X capacitors of 6.8 μH each were inserted on the line side and the inductance of the secondary passive filter stage was additionally increased by about 10 μH per phase. For this purpose, a core slid over each phase was used to increase the leakage inductance. A further suppression of the common-mode interference signals in the relevant frequency range of greater than or equal to 150 kHz and less than or equal to 30 MHz is clearly visible.

Figure 10E:
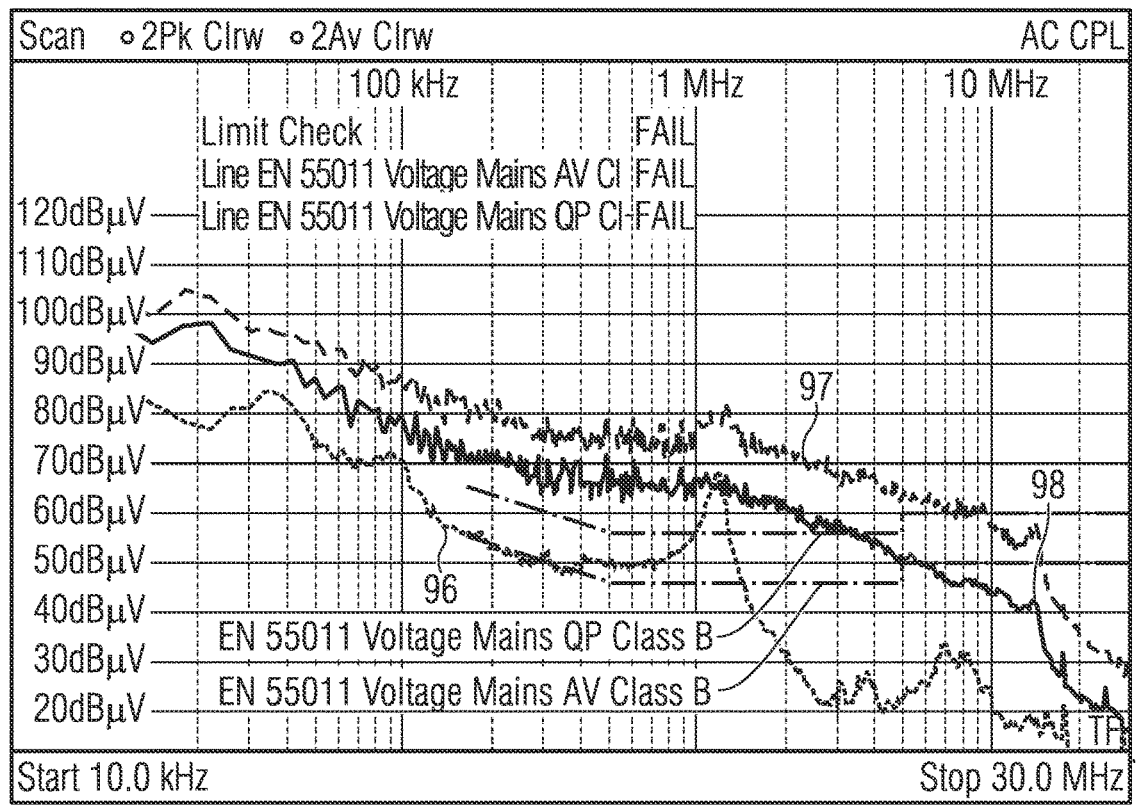

FIG. 10E shows a comparison of the frequency spectrum 96 of the common-mode noise signals after filtering by the hybrid filter circuit used for the measurement in FIG. 10C, i.e. with an active filter unit and a secondary passive filter stage, with the quasipeak and average frequency spectra 97, 98 of the common-mode noise signals after filtering by a conventional passive filter with a common-mode choke (in particular without line-side X capacitors for better comparability). For this purpose, load-side X capacitors with 4.7 μF and load-side Y capacitors with 470 nF from the star point of the X capacitors as well as a common-mode choke with an inductance of 1.1 mH were used. Among other things, despite the considerably larger inductance of the coil in the usual passive filter, a significantly better filter performance can be seen from the hybrid concept described here, especially in the relevant frequency range of greater than or equal to 150 kHz and less than or equal to 30 MHz.

The features and embodiments described in connection with the figures can be combined with each other according to further embodiments, even if not all combinations are explicitly described. Furthermore, the embodiments described in connection with the figures may alternatively or additionally have further features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

LIST OF REFERENCE NUMERALS 1 coil
2 capacitor
11, 12 passive filter stage
20 active filter unit
21, 22 active filter stage
91, 92 common mode interference signals
93, 94, 95, 96, 96', 97, 98 frequency spectrum
100 hybrid filter circuit
101 filter unit
102 load terminal
103 supply terminal
110 power line
111, 112, 113 phase
200 electrical device
201 sensor
202 feedback unit
203 active amplifier unit
204 preamplifier stage
205 main amplifier stage
206 output resistance
207 coupling circuit
208 feedback resistor
209 matching circuit
210 burden resistor
211 amplifier stage
290 motor
291 frequency inverter
298 line impedance stabilization network
299 measuring device
300 power grid
1000 system
1002 load side
1003 supply side

The invention claimed is:

1. A hybrid filter circuit for reducing common-mode interference signals at least with frequencies greater than or equal to 150 kHz in a power line with at least one phase, comprising
   at least one first passive filter stage and
   an active filter unit with at least one first active filter stage,
      wherein the hybrid filter circuit can be coupled to an electrical device on a load side via a load terminal and to a power grid on a supply side via a supply terminal, and the power grid and the electrical device are coupled directly or indirectly via the power line, wherein the first active filter stage comprises a sensor for measuring a common mode noise signal in the power line and a feedback unit with an active amplifier unit for generating a compensation signal counteracting the common mode noise signal, which is coupled into the power line via an output of the first active filter stage, wherein the at least one passive filter stage and the active filter circuit are arranged in cascade between the load terminal and the supply terminal.

2. The hybrid filter circuit according to claim 1, wherein the common mode noise signal comprises a common mode noise signal current in the power line having a common mode noise signal current strength, and the sensor is a current sensor.

3. The hybrid filter circuit according to claim 1, wherein the at least one first active filter stage is arranged to generate the compensation signal with a compensation signal current strength having substantially the same amplitude as the common mode noise signal current strength, and the compensation signal is coupled into the power line substantially opposite to the common mode noise signal current.

4. The hybrid filter circuit according to claim 1, wherein the active amplifier unit of the at least one first active filter stage comprises at least one preamplifier stage and a main amplifier stage coupled to an output of the preamplifier stage.

5. The hybrid filter circuit according to claim 4, wherein the preamplifier stage comprises an operational amplifier or a discrete transistor circuit.

6. The hybrid filter circuit according to claim 4, wherein the main amplifier stage is a class B or class AB amplifier constructed from a discrete transistor circuit.

7. The hybrid filter circuit according to claim 1, wherein the first active filter stage is configured to generate a compensation current strength of greater than or equal to 1 ampere.

8. The hybrid filter circuit according to claim 1, wherein an output of the main amplifier is coupled to an input of the preamplifier stage.

9. The hybrid filter circuit according to claim 1, wherein the active filter unit comprises at least one further active filter stage arranged between the first active filter stage and the power supply network immediately downstream of the first active filter stage.

10. The hybrid filter circuit according to claim 9, wherein the first active filter stage is configured to provide a higher output current than the second active filter stage.

11. The hybrid filter circuit according to claim 9, wherein the second active filter stage comprises an operational amplifier and is free of a main amplifier stage.

12. The hybrid filter circuit according to claim 1, wherein the active filter unit consists of the first active filter stage.

13. The hybrid filter circuit according to claim 1, wherein the at least one first passive filter stage is arranged on the supply side as viewed from the active filter unit.

14. The hybrid filter circuit according to claim 1, wherein the at least one first passive filter stage is arranged on the load side as viewed from the active filter unit.

15. The hybrid filter circuit according to claim 1, wherein the at least one first passive filter stage is formed by at least one coil and one or more capacitors.

16. The hybrid filter circuit according to claim 1, wherein the first passive filter stage has a cutoff frequency and a resonant frequency that are less than 150 kHz.

17. The hybrid filter circuit according to claim 1, wherein a second passive filter stage is provided and the active filter unit is arranged between the first passive filter stage and the second passive filter stage.

18. A system comprising
a power grid and an electrical device coupled directly or indirectly via a power line,
a hybrid filter circuit according to claim 1, coupled at the load side to the electrical device via the load terminal and coupled at the supply side to the power grid via the supply terminal.

* * * * *